(12) United States Patent
Wang et al.

(10) Patent No.: US 10,516,123 B1
(45) Date of Patent: Dec. 24, 2019

(54) FLEXIBLE DISPLAY PANEL, MANUFACTURING METHOD THEREOF AND FLEXIBLE DISPLAY DEVICE

(71) Applicant: BOE TECHNOLOGY GROUP CO., LTD., Beijing (CN)

(72) Inventors: Tao Wang, Beijing (CN); Song Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/413,044

(22) Filed: May 15, 2019

(30) Foreign Application Priority Data

Nov. 22, 2018 (CN) .......................... 2018 1 1399772

(51) Int. Cl.
| | | |
|---|---|---|
| *H01L 51/00* | (2006.01) | |
| *G09F 9/30* | (2006.01) | |
| *H01L 51/56* | (2006.01) | |
| *H01L 51/52* | (2006.01) | |

(52) U.S. Cl.
CPC .......... *H01L 51/0097* (2013.01); *G09F 9/301* (2013.01); *H01L 51/5256* (2013.01); *H01L 51/56* (2013.01)

(58) Field of Classification Search
CPC . H01L 51/0097; H01L 51/5256; H01L 51/56; H01L 51/5237; H01L 51/524; H01L 51/5253; G09F 9/301; H05B 33/04
See application file for complete search history.

(56) References Cited

U.S. PATENT DOCUMENTS

2018/0355181 A1* 12/2018 Yoon ...................... C09B 69/106

* cited by examiner

*Primary Examiner* — Joseph L Williams
*Assistant Examiner* — Jose M Diaz
(74) *Attorney, Agent, or Firm* — McDermott Will & Emery LLP (57) ABSTRACT

A flexible display panel, a manufacturing method thereof and a flexible display device are provided. The flexible display panel includes a base substrate; and a thin film encapsulation structure on the base substrate, the thin film encapsulation structure including an organic encapsulation layer, wherein the flexible display panel has a bending axis, about which the base substrate and the organic encapsulation layer is bendable, and wherein the organic encapsulation layer contains an organic material, a polymer chain of the organic material extends in an orientation direction, and an included angle between the orientation direction of the polymer chain and an extending direction of the bending axis is not equal to zero.

19 Claims, 9 Drawing Sheets

FLEXIBLE DISPLAY PANEL, MANUFACTURING METHOD THEREOF AND FLEXIBLE DISPLAY DEVICE

CROSS-REFERENCE TO RELATED APPLICATION

This application claims the benefit of Chinese Patent Application No. 201811399772.1 filed on Nov. 22, 2018 in the State Intellectual Property Office of China, the whole disclosure of which is incorporated herein by reference.

TECHNICAL FIELD

The present disclosure relates to the field of display technologies, and in particular, to a flexible display panel, a method of manufacturing a flexible display panel and a flexible display device.

BACKGROUND

An electroluminescent display device such as an organic light emitting diode (OLED) display device has become an important display technology in the display field due to its advantages of wide viewing angle, active illumination, fast response, low power consumption, high luminous efficiency, and flexible display practicality. Meanwhile, an OLED device in the OLED display device is susceptible to invasion of water and oxygen, so that an effective encapsulation structure is needed to prevent water and oxygen from invading into the OLED device. In order to obtain a flexible display device, it has become an important issue in the field of flexible display to improve an impact resistance ability and a bendability of the encapsulation structure.

SUMMARY

In an aspect, a flexible display panel is provided including a base substrate; and a thin film encapsulation structure on the base substrate, the thin film encapsulation structure including an organic encapsulation layer, wherein the flexible display panel has a bending axis, about which the base substrate and the organic encapsulation layer are bendable, and wherein the organic encapsulation layer includes an organic material, a polymer chain of the organic material extends in an orientation direction, and an included angle between the orientation direction of the polymer chain and an extending direction of the bending axis is not equal to zero.

Optionally, the polymer chain of the organic material is a linear chain extending in the orientation direction.

Optionally, the included angle is in a range of 80 to 100 degrees.

Optionally, the included angle is about 90 degrees.

Optionally, the organic material is a host material of the organic encapsulation layer, or the organic encapsulation layer includes a host material and the organic material doped in the host material.

Optionally, the organic material includes an azobenzene group or a cinnamoyl group.

Optionally, the organic material includes a vinyl ether monomer.

Optionally, the thin film encapsulation structure further includes a first inorganic encapsulation layer on the base substrate, the first inorganic encapsulation layer being disposed between the base substrate and the organic encapsulation layer.

Optionally, the thin film encapsulation structure further includes a second inorganic encapsulation layer on a side of the organic encapsulation layer facing away from the base substrate.

Optionally, the flexible display panel further includes an OLED device on the base substrate, the OLED device being encapsulated by the thin film encapsulation structure.

In another aspect, a flexible display device is provided including the flexible display panel as stated above.

In a further aspect, a method of manufacturing a flexible display panel is provided, including: depositing an organic material on a base substrate to form an organic encapsulation layer; and orienting the organic material such that a polymer chain of the organic material extends in an orientation direction, wherein an included angle between the orientation direction and an extending direction of a bending axis of the flexible display panel is not equal to zero.

Optionally, orienting the organic material such that the polymer chain of the organic material extends in the orientation direction includes: orienting the organic material by means of field induction such that the polymer chain of the organic material extends in the orientation direction, wherein the field induction includes at least one selected from a group consisting of electric field induction, light orientation field induction, and magnetic field induction.

Optionally, depositing the organic material on the base substrate to form the organic encapsulation layer includes: depositing an organic material including an azobenzene group or a cinnamoyl group on the base substrate to form the organic encapsulation layer, wherein orienting the organic material such that the polymer chain of the organic material extends in the orientation direction includes: orienting the azobenzene group or the cinnamoyl group of the organic material by means of the light orientation field induction such that the polymer chain of the organic material extends in the orientation direction.

Optionally, depositing the organic material on the base substrate to form the organic encapsulation layer includes: depositing an organic material including a vinyl ether monomer on the base substrate to form the organic encapsulation layer, wherein orienting the organic material such that the polymer chain of the organic material extends in the orientation direction includes: orienting the vinyl ether monomer of the organic material by means of the electric field induction such that the polymer chain of the organic material extends in the orientation direction.

Optionally, a direction of a light orientation field or a direction of an electric field is perpendicular to the extending direction of the bending axis of the flexible display panel.

Optionally, the method further includes: forming a first inorganic encapsulation layer on the base substrate such that the first inorganic encapsulation layer is located between the base substrate and the organic encapsulation layer.

Optionally, the method further includes: forming a second inorganic encapsulation layer on a side of the organic encapsulation layer facing away from the base substrate.

Optionally, the method further includes: forming an OLED device on the base substrate such that the OLED device is encapsulated by all the first inorganic encapsulation layer, the organic encapsulation layer, and the second inorganic encapsulation layer.

BRIEF DESCRIPTION OF THE DRAWINGS

The drawings are used to provide a further understanding of the technical solutions of the present disclosure, and are to be considered as a part of the specification. Further, the drawings together with embodiments of the present disclosure are used to explain the technical solutions of the present disclosure, and are not to be construed as limiting the scope of the present disclosure.

DETAILED DESCRIPTION OF EMBODIMENTS

Embodiments of the present disclosure will be described in detail below, and examples of the embodiments are illustrated in the accompanying drawings, wherein the same or similar reference numerals are used to refer to the same or similar elements or elements having the same or similar functions. The embodiments described below with reference to the accompanying drawings are intended to be only illustrative, and are not to be construed as limiting the present disclosure.

It is to be noted that the size and thickness of each configuration shown in the drawings are arbitrarily shown for better understanding and ease of description, but the present disclosure is not limited thereto. In the drawings, for example, the thickness of layers, films, panels, regions, etc., are exaggerated for clarity.

In descriptions of the present disclosure, orientational or positional relationships indicated by terms such as "upper", "lower" and the like are based on the orientational or positional relationships shown in the drawings, and are merely for the convenience of describing the present disclosure and do not require that the present disclosure must be constructed and operated in particular orientations, thus they are not to be construed as limiting the present disclosure.

In the descriptions of the present specification, descriptions referring to terms such as "one embodiment", "another embodiment" and the like mean that specific features, structures, materials or characteristics described in connection with the embodiment are included in at least one embodiment of the present disclosure. In the present specification, illustrative descriptions on the above terms are not necessarily directed to the same embodiment or example. Furthermore, the specific features, structures, materials, or characteristics may be combined in a suitable manner in any one or more embodiments or examples. In addition, various embodiments or examples described in the specification and features in various embodiments or examples may be combined and grouped without departing from the scope of the present disclosure. In addition, it should be noted that in the present specification, terms such as "first" and "second" are used for descriptive purposes only, and are not to be construed as indicating or implying a relative importance or implicitly indicating the number of indicated technical features.

Figure 1:
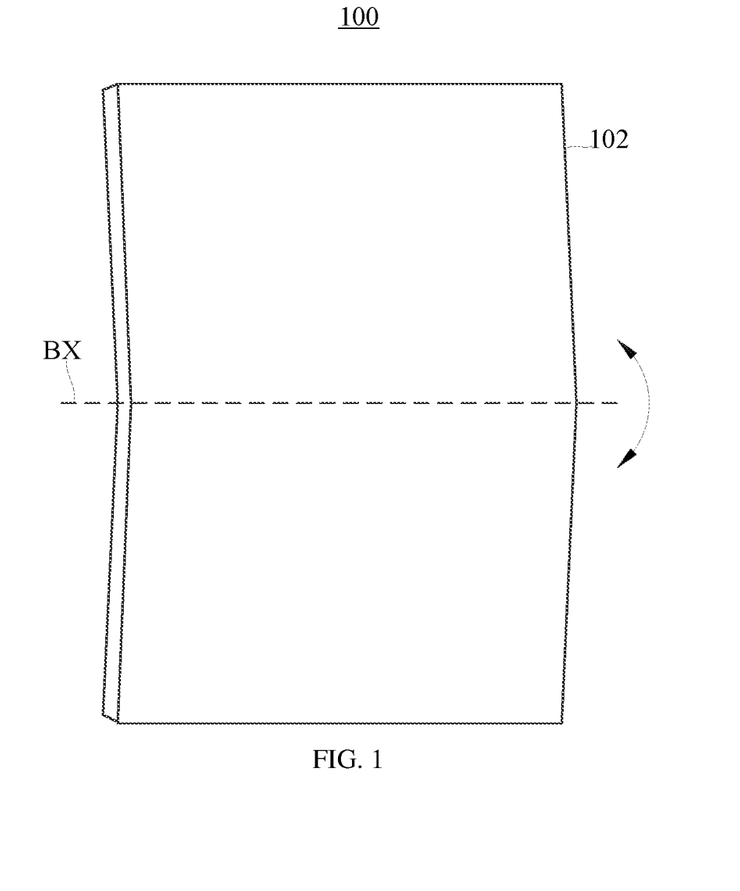
FIG. 1 is a schematic perspective view of a flexible display device according to some exemplary embodiments of the present disclosure.

FIG. 1 is a schematic perspective view of a flexible display device according to some exemplary embodiments of the present disclosure. As shown in FIG. 1, the flexible display device 100 includes a flexible display panel 102 that is bendable about a bending axis BX. For example, the flexible display device 100 may be a flexible organic light emitting diode (OLED) display device, however, embodiments of the present disclosure are not limited thereto, for example, in other embodiments, the flexible display device 100 may be a flexible quantum dot light emitting diode (QLED) display device, a flexible micro-LED display device, and the like.

Hereinafter, embodiments of the present disclosure will be further described by taking the flexible organic light emitting diode (OLED) display device as an example.

Figure 2A:
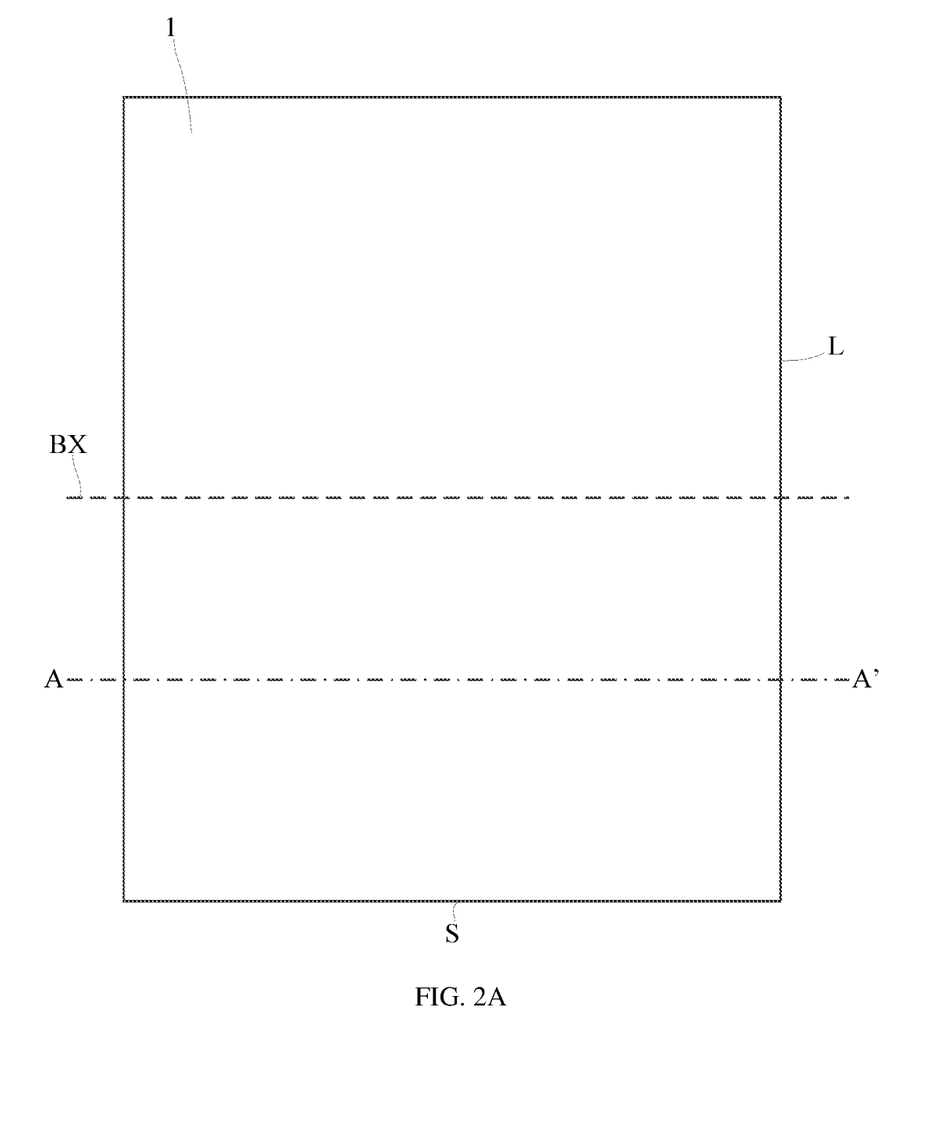
FIG. 2A and FIG. 2B are plan views of a flexible display panel of FIG. 1 in an unfolded state.
Figure 2B:
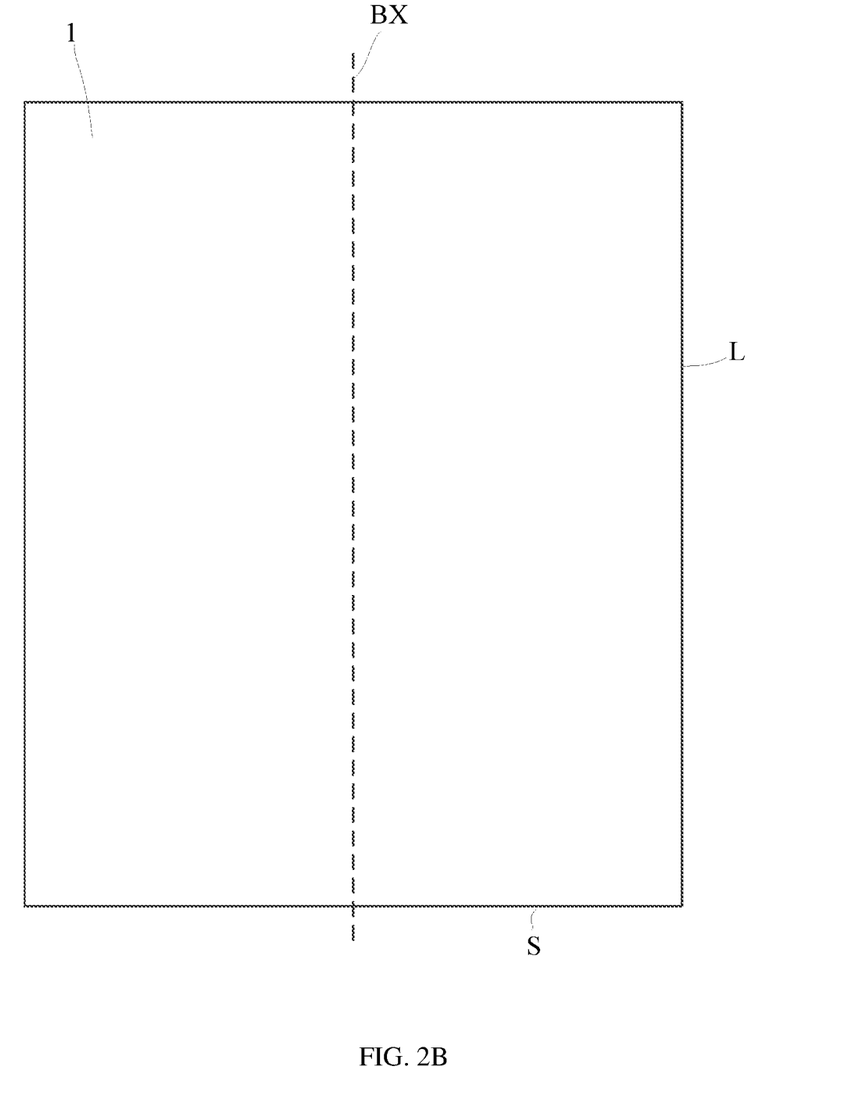
Figure 3:
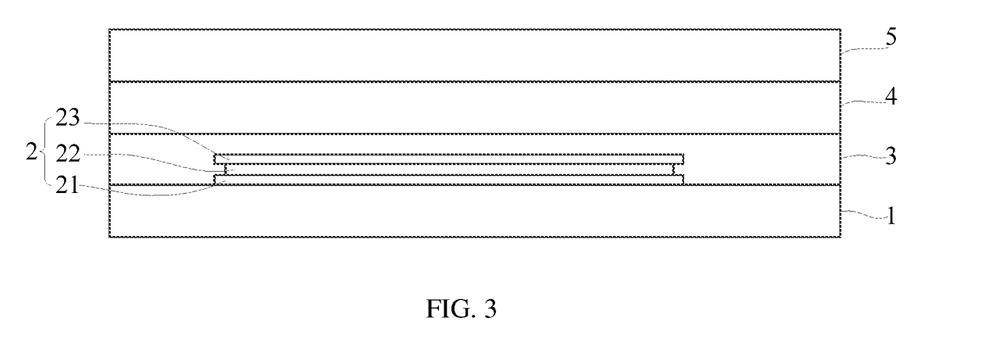
FIG. 3 is a cross-sectional view of the flexible display panel taken along line AA' in FIG. 2A.

FIG. 2A and FIG. 2B are plan views of the flexible display panel of FIG. 1 in an unfolded state, and FIG. 3 is a cross-sectional view of the flexible display panel taken along line AA' in FIG. 2A. As shown in FIG. 2A, the flexible display panel 102 may include a base substrate 1. For example, the base substrate 1 may have a substantially rectangular shape, and the "substantially rectangular shape" herein includes a right-angled rectangular shape, a rounded rectangular shape, and the like. The base substrate 1 of substantially rectangular shape may have a long side L and a short side S. As shown in FIG. 2A, the bending axis BX may be parallel to an extending direction of the short side S, and the bending axis BX may be located at a substantially central position of the long side L, or the bending axis BX may be located at a position close to the edge of the long side L. Alternatively, as shown in FIG. 2B, the bending axis BX may be parallel to an extending direction of the long side L, and the bending axis BX may be located at a substantially central position of the short side S, or the bending axis BX may be located at a position close to the edge of the short side S. In the embodiments of the present disclosure, the extending direction and the setting position of the bending axis BX are not particularly limited as long as the display panel 102 is bendable about the bending axis BX.

For example, the base substrate 1 may be made of a flexible material such as a flexible plastic material, however, the embodiments of the present disclosure are not limited thereto. In other embodiments, the base substrate 1 may be formed of a metal substrate made of stainless steel and various flexible materials, or the base substrate 1 may be formed of plastic materials having excellent heat resistance and durability, for example, the plastic materials may include polyethylene ether phthalate, polyethylene naphthalene, polycarbonate, polyarylate, polyetherimide, polyethersulfone or polyimide, or the like.

Referring to FIG. 3, the flexible display panel 102 may further include an OLED device 2 disposed on the base substrate 1. For example, the OLED device 2 may include an anode 21, a cathode 23, and functional layers 22 interposed between the anode 21 and the cathode 23. The functional layers 22 may include a hole injection layer, a hole transport layer, a luminescent layer, an electron transport layer, an electron injection layer, and the like. The OLED device 2 may employ an OLED device commonly used in the related art, and details are omitted herein.

Through researches, the inventors have found that electrons are injected from the cathode to the electron transport layer when the OLED device is in operation, and it is required to form the cathode of a material having a work function close to that of the luminescent layer in order to increase the quantity of injected carriers and improve the luminous efficiency, that is, it is required to form the cathode of low work function metal so as to reduce the energy level barrier. For example, such low work function metal may include magnesium, aluminum, and silver, all of which are active materials that are highly reactive with water and oxygen in the environment, resulting in the OLED device failure. Meanwhile, the hole transport layer and the electron transport layer are also susceptible to invasion of water and oxygen, resulting in a shortened device life. Therefore, it is required to provide an encapsulation structure to effectively prevent the invasion of water and oxygen, thereby preventing aging of organic materials and prolonging the life of the OLED device.

For example, the encapsulation structure may include a thin film encapsulation (TFE) structure. As shown in FIG. 3, the thin film encapsulation structure may include a multi-layered structure including an organic encapsulation layer and an inorganic encapsulation layer, and specifically, may include a first inorganic encapsulation layer 3, an organic encapsulation layer 4 and a second inorganic encapsulation layer 5. The first inorganic encapsulation layer 3, the organic encapsulation layer 4 and the second inorganic encapsulation layer 5 are sequentially disposed on the base substrate 1, and the organic encapsulation layer 4 is sandwiched between the first inorganic encapsulation layer 3 and the second inorganic encapsulation layer 5. The thin film encapsulation structure composed of the first inorganic encapsulation layer 3, the organic encapsulation layer 4 and the second inorganic encapsulation layer 5 covers the OLED device 2 to prevent the OLED device from being invaded by water and oxygen. Specifically, the first inorganic encapsulation layer 3 and the second inorganic encapsulation layer 5 mainly function to block water and oxygen, and the organic encapsulation layer 4 mainly functions as both planarization layer and stress release layer.

For example, the first inorganic encapsulation layer 3 may have a single-layered or a multi-layered structure and may be formed of an inorganic material. The inorganic material may be one selected from $Al_2O_3$, $TiO_2$, $ZrO_2$, MgO, $HfO_2$, $Ta_2O_5$, $Si_3N_4$, AlN, SiN, SiNO, SiO, $SiO_2$, $SiO_x$, SiC or ITO, or a combination thereof, but the embodiments of the present disclosure are not limited thereto. For another example, the first inorganic encapsulation layer 3 may have a thickness of 100 nm to 1000 nm and a refractive index of 1.5 to 2.5.

The second inorganic encapsulation layer 5 may have the same structure and material as the first inorganic encapsulation layer 3, or the second inorganic encapsulation layer 5 may have a different structure and material from the first inorganic encapsulation layer 3. For example, the second inorganic encapsulation layer 5 may have a single-layered or a multi-layered structure and may be formed of an inorganic material. The inorganic material may be one selected from $Al_2O_3$, $TiO_2$, $ZrO_2$, MgO, $HfO_2$, $Ta_2O_5$, $Si_3N_4$, AlN, SiN, SiNO, SiO, $SiO_2$, $SiO_x$, SiC or ITO, or a combination thereof, but the embodiments of the present disclosure are not limited thereto. For another example, the second inorganic encapsulation layer 5 may have a thickness of 100 nm to 1000 nm and a refractive index of 1.5 to 2.5.

For example, the organic encapsulation layer 4 may have a single-layered or a multi-layered structure and may be formed of an organic material such as a polymer. The organic material may include acrylates, polyurethanes, epoxies, silicones, and the like. Alternatively, the organic material may be one of PET (polyethylene terephthalate), PEN (polyethylene naphthalate), PC (polycarbonate), PI (polyimide), PVC (Polyvinyl chloride), PS (polystyrene), PMMA (polymethyl methacrylate), PBT (polybutylene terephthalate), PSO (polysulfone), PES (poly(p-phenylene sulfone)), PE (polyethylene), PP (polypropylene), silicone, PA (polyamide), PVDF (polyvinylidene fluoride), EVA (ethylene-vinyl acetate copolymer), EVAL (ethylene-vinyl alcohol copolymer), PAN (polypropylene cyanide), PVAc (polyvinyl acetate), parylene, polyurea, PTFE (polytetrafluoroethylene) and epoxy resin, or a combination thereof, but the embodiments of the present disclosure are not limited thereto. For another example, the organic encapsulation layer 4 may have a thickness of 2 μm to 20 μm and a refractive index of 1.5 to 2.0.

As described above, the material forming the organic encapsulation layer 4 includes an organic material such as polymer, and the organic material includes a polymer chain. The polymer chain herein refers to a polymer chain through which monomers are linked through polymerization. For example, the organic encapsulation layer 4 may include a polyacrylate which may contain a polymer main-chain as shown in the following formula.

Figure 4:
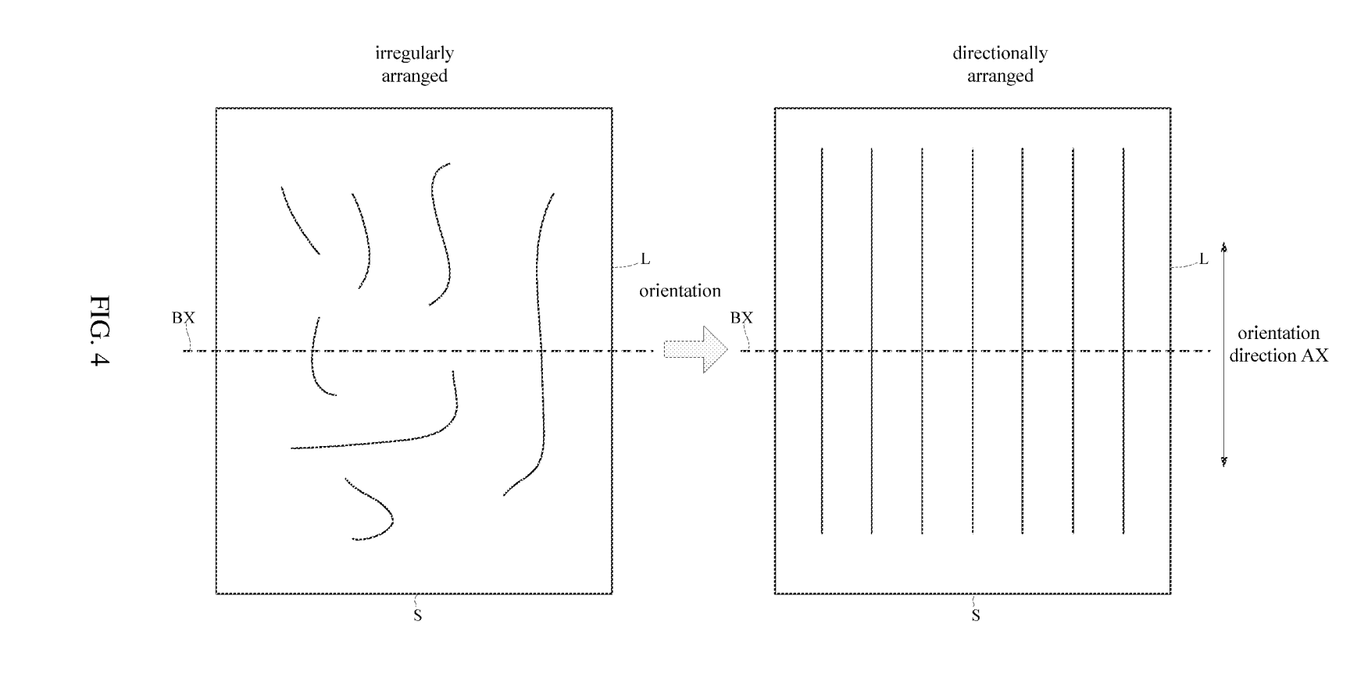
FIG. 4 is a schematic view illustrating an orientation process of polymer chains of the organic material in the organic encapsulation layer according to some embodiments of the present disclosure.

FIG. 4 is a schematic view illustrating an orientation process of polymer chains of the organic material in the organic encapsulation layer according to some embodiments of the present disclosure. As shown in left drawing of FIG. 4, when no field induction is applied, the polymer chains of the organic material may extend in curved lines, or the polymer chains may be irregularly oriented in the organic encapsulation layer. As shown in right drawing of FIG. 4, after the field induction is applied, the polymer chains of the organic material may extend in straight lines, and the the polymer chains are directionally arranged in the organic encapsulation layer. The process illustrated in FIG. 4 may be referred to as the orientation process of the organic material. As shown in FIG. 4, after the orientation process, the polymer chains of the organic material may be oriented in the same direction or extend in the same direction, which direction may be referred to as an orientation direction AX. The macroscopic properties of the organic material in the orientation direction may appear to be different from that in other directions, that is, the organic material may exhibit anisotropy. For example, in terms of mechanical properties, strength and rigidity of the organic material in the orientation direction are significantly increased while strength and rigidity of the organic material in a direction perpendicular to the orientation direction may be decreased.

Figure 5:
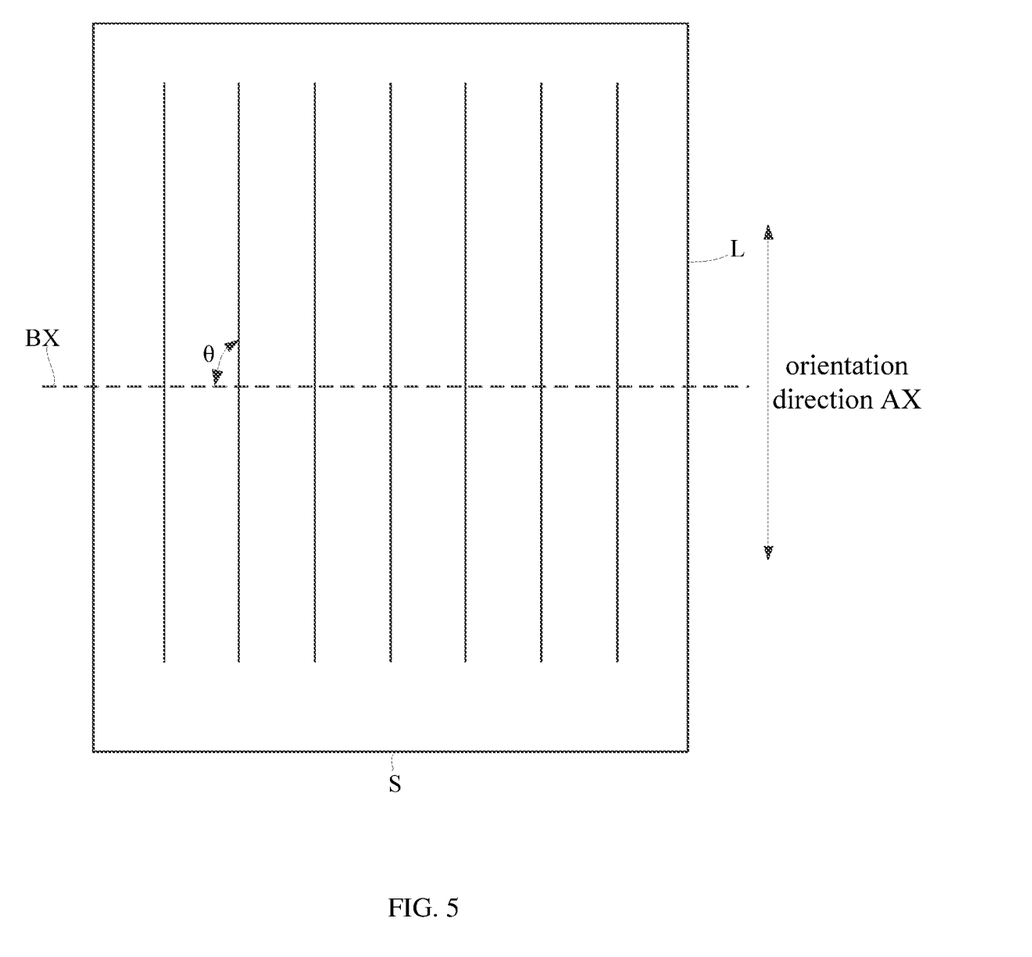
FIG. 5 is a schematic plan view of a flexible display panel according to some embodiments of the present disclosure, in which a relationship between the orientation direction of the polymer chain and an extending direction of the bending axis is schematically shown.
Figure 6:
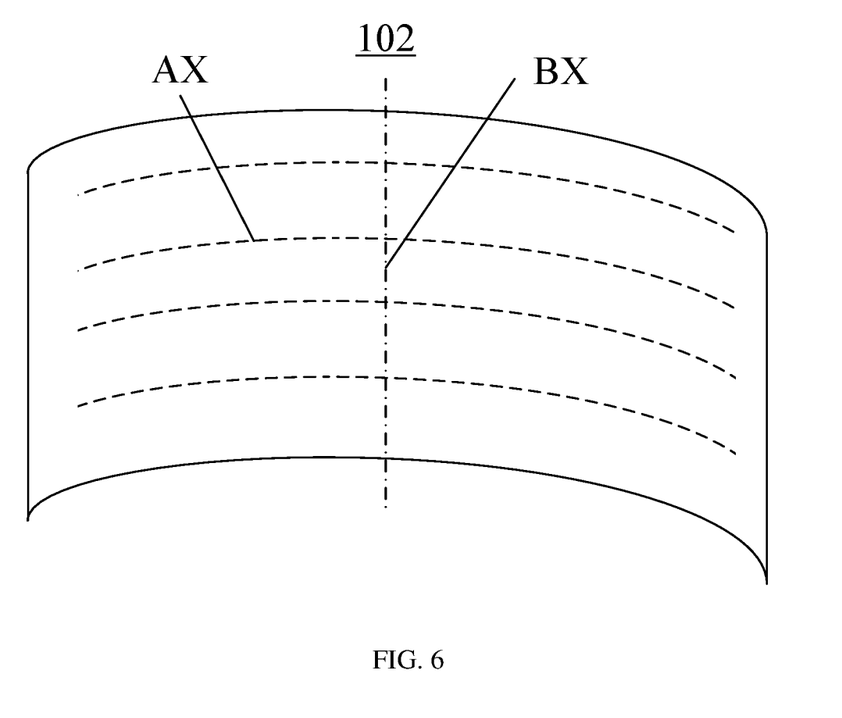
FIG. 6 is a schematic view of a flexible display panel according to some embodiments of the present disclosure in a bent state.

For example, FIG. 5 is a schematic plan view of a flexible display panel according to some embodiments of the present disclosure, in which a relationship between the orientation direction of the polymer chain and an extending direction of the bending axis is schematically shown. As shown in FIG. 5, an included angle θ between the orientation direction AX of the polymer chain of the organic material of the organic encapsulation layer 4 and the extending direction of the bending axis BX is about 90 degrees, that is, the orientation direction AX of the polymer chain is perpendicular to the extending direction of the bending axis BX. Thus, as shown in FIG. 6, when the flexible display panel 102 is bent, the base substrate 1 and various encapsulation layers thereon are also bent about the bending axis BX, so that stress is generated in the organic encapsulation layer 4 in a direction perpendicular to the extending direction of the bending axis BX. Since the orientation direction of the polymer chain of the organic material of the organic encapsulation layer 4 is perpendicular to the extending direction of the bending axis BX, the mechanical properties of the organic encapsulation layer 4 in the orientation direction (i.e., the direction perpendicular to the bending axis BX) are increased, so that the organic encapsulation layer 4 is capable of withstanding a large stress in the direction perpendicular to the extending direction of the bending axis BX. As a result, the bendability of the organic encapsulation layer 4 is improved, correspondingly the bendability of the flexible display panel is improved.

Further, the flexible display panel may be subjected to impact by a foreign object, for example, a foreign object may fall onto the flexible display panel to apply an impact force to the flexible display panel. At this time, the impact force may cause stress waves to be generated in the organic encapsulation layer. The inventors have found through research that the stress waves (i.e., incident waves) include components of longitudinal waves (positive stress waves) and components of transverse waves (tangent stress waves) depending on the organic encapsulation layer and the force-applied conditions. As the incident waves propagate in the organic encapsulation layer, reflected waves may be generated when the incident waves encounter a free surface. For example, the longitudinal waves may be compression waves perpendicular to the surface while the reflected waves may be tensile waves perpendicular to the surface. When two or more stress waves meet, a complex interference phenomenon will occur. According to the superposition principle of the incident waves and the reflected waves, a peak stress at a certain section may be calculated. When the peak stress exceeds a strength limit of the organic material, the organic material may be damaged due to the impact. In the above embodiments, the orientation direction of the polymer chain of the organic material of the organic encapsulation layer 4 is perpendicular to the extending direction of the bending axis BX, so that the tensile waves may be prevented from continuing to propagate in the direction perpendicular to the extending direction of the bending axis BX, thereby avoiding the peak stress which is generated through the superposition of the incident waves and the reflected waves. In this way, the impact resistance ability of the organic encapsulation layer is improved, thereby improving the impact resistance ability of the flexible display panel.

Figure 7:
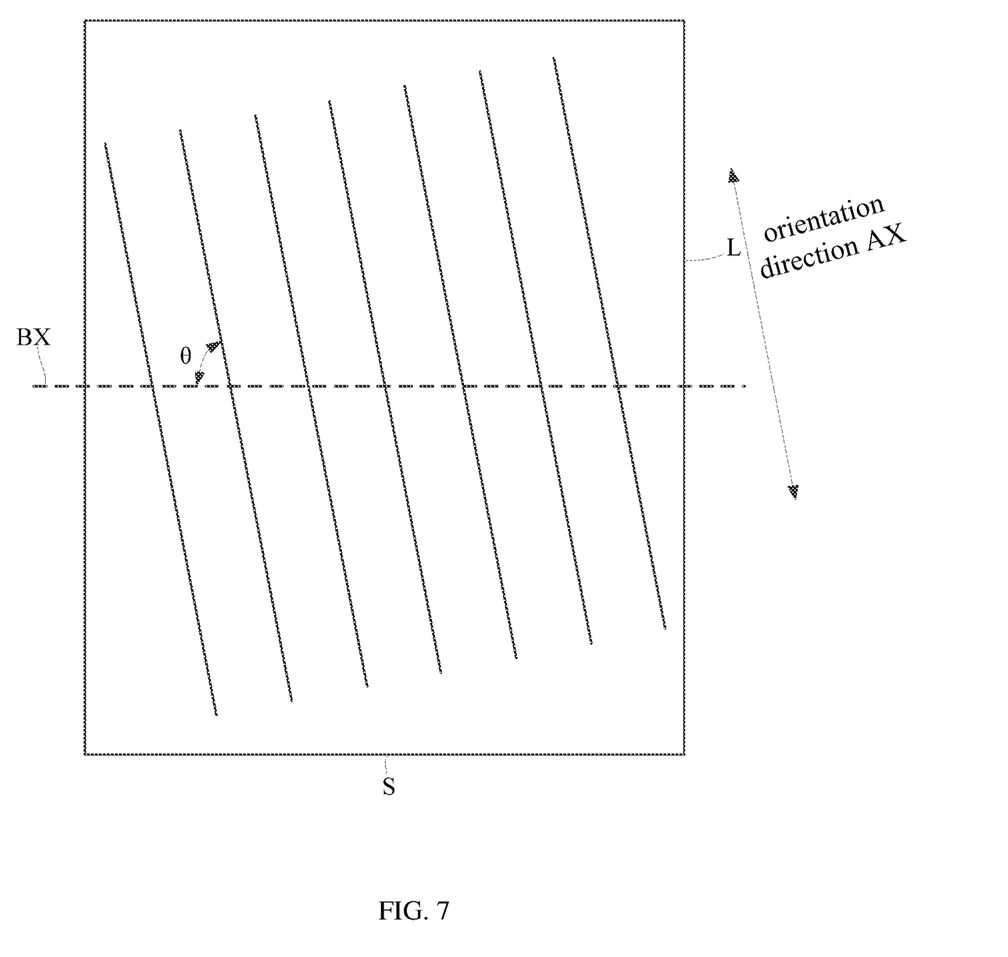
FIG. 7 is a schematic plan view of a flexible display panel according to some embodiments of the present disclosure, in which a relationship between the orientation direction of the polymer chain and an extending direction of the bending axis is schematically shown.

Alternatively, the included angle θ between the orientation direction AX of the polymer chain of the organic material of the organic encapsulation layer 4 and the extending direction of the bending axis BX may be other angles, for example, the included angle θ may be in a range of 80 to 100 degrees. Alternatively, the included angle θ may be 30 degrees, 45 degrees, or 60 degrees. As shown in FIG. 7, a case where the orientation direction AX of the polymer chain of the organic material of the organic encapsulation layer 4 is inclined with respect to the extending direction of the bending axis BX is shown. The inventors have found that, in the case where the included angle θ between the orientation direction AX of the polymer chain of the organic material of the organic encapsulation layer 4 and the extending direction of the bending axis BX is not equal to zero, that is, in the case where the orientation direction AX of the polymer chain of the organic material of the organic encapsulation layer 4 and the extending direction of the bending axis BX are not parallel with each other, when an impact force is applied to the flexible display panel, the tensile waves may be still prevented from continuing to propagate in the organic encapsulation layer, thereby avoiding the peak stress which is generated through the superposition of the incident waves and the reflected waves. In this way, the impact resistance ability of the organic encapsulation layer is improved, thereby improving the impact resistance ability of the flexible display panel. In addition, the bendability of the organic encapsulation layer may still be improved to some extent, thereby improving the bendability of the flexible display panel.

In some embodiments of the present disclosure, the organic material may be a host material of the organic encapsulation layer 4, that is, the organic material may be a main component of the organic encapsulation layer 4. Alternatively, the organic encapsulation layer 4 may include a host material and the above-described organic material doped in the host material. Thus, after the organic material of the organic encapsulation layer 4 is oriented, the impact resistance ability and the bendability of the organic encapsulation layer may be improved.

Figure 8:
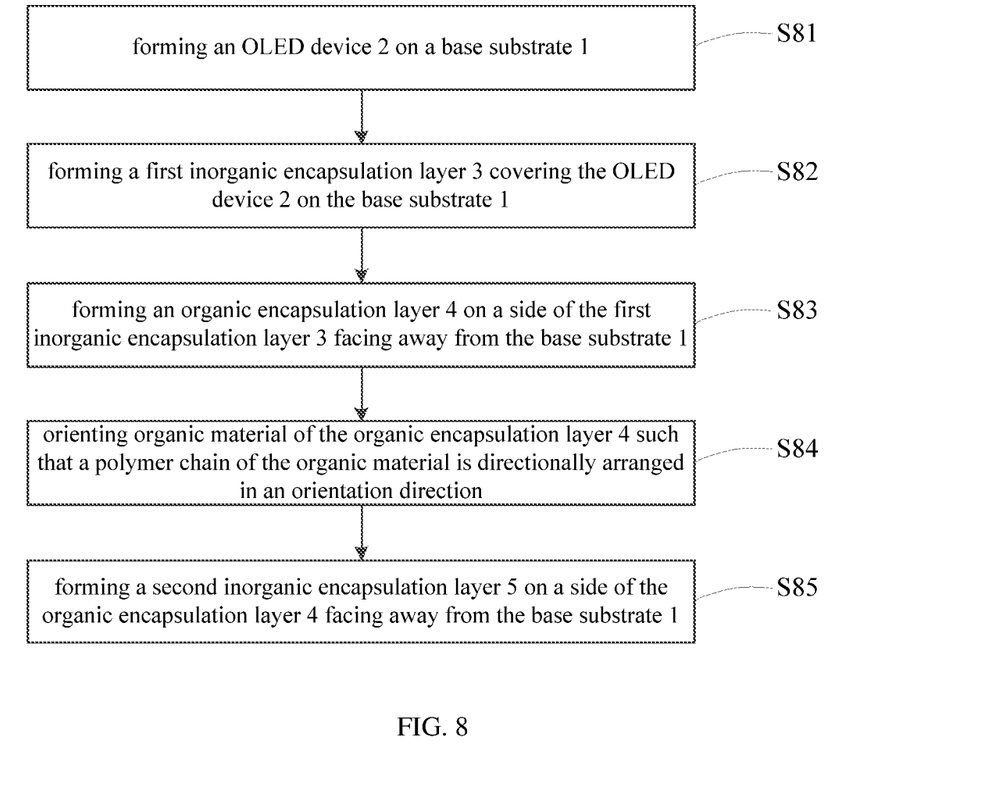
FIG. 8 is a flowchart of a method of manufacturing a flexible display panel according to some embodiments of the present disclosure.

FIG. 8 is a flowchart of a method of manufacturing a flexible display panel according to some embodiments of the present disclosure. Referring to FIGS. 3 and 8, the method may be performed as follows.

In step S81, the OLED device 2 is formed on the base substrate 1. For example, various layers of the OLED device 2 may be formed by evaporation or the like. Alternatively, circuit structures such as thin film transistors and conductive wires may be formed on the base substrate 1 before the OLED device 2 is formed.

In step S82, the first inorganic encapsulation layer 3 covering the OLED device 2 is formed on the base substrate 1. For example, the first inorganic encapsulation layer 3 may be formed by PECVD (vapor deposition), sputter (spraying and sputtering), atomic vapor deposition, vacuum evaporation, flash evaporation, transfer printing or the like.

In step S83, the organic encapsulation layer 4 is formed on a side of the first inorganic encapsulation layer 3 facing away from the base substrate 1. For example, the organic encapsulation layer 4 may be formed by inkjet printing, screen printing, slit coating, or the like.

In step S84, the organic material of the organic encapsulation layer 4 are oriented such that the polymer chain of the organic material are directionally arranged in the orientation direction, for example, such that the orientation direction of the polymer chain of the organic material is perpendicular to the extending direction of the bending axis BX.

For example, the organic material of the organic encapsulation layer 4 may be oriented by means of field induction. Specifically, the field induction may include electric field induction, light orientation field induction, magnetic field induction, or mechanical field induction.

For example, the organic material of the organic encapsulation layer 4 may contain an azobenzene group or a cinnamoyl group, and the azobenzene group or the cinnamoyl group is oriented under the induction of a light orientation field such as plane-polarized light. Specifically, the light orientation field may be applied on the organic encapsulation layer 4 containing the azobenzene group or the cinnamoyl group, and a direction of the light orientation field may be perpendicular to the extending direction of the bending axis of the flexible display panel, such that the orientation direction of the polymer chain of the organic material is perpendicular to the extending direction of the bending axis BX.

For example, the organic material of the organic encapsulation layer 4 may contain an organic monomer of a vinyl ether type (i.e., vinyl ether monomer), and the organic monomer of the vinyl ether type may be oriented under the induction of an electric field. An external electric field may be applied on the organic encapsulation layer 4, and a direction of the electric field may be perpendicular to the extending direction of the bending axis of the flexible display panel, such that the orientation direction of the polymer chain of the organic material is perpendicular to the extending direction of the bending axis BX. Specifically, the organic monomers of the vinyl ether type are polymerized and oriented under the induction of the electric field to form a polymer chain compound. During the induction, an anode of the electric field is opposite to a cathode of the electric field in such a way that the direction of the electric field formed after the anode and the cathode are applied with electric voltages is perpendicular to the extending direction of the bending axis.

For example, the organic material of the organic encapsulation layer 4 may contain an organic monomer doped with magnetic particles (for example, Fe3O4 nanoparticles), and the magnetic particles are oriented under the induction of a magnetic field. A magnetic field may be applied on the organic encapsulation layer 4, and the direction of the magnetic field may be perpendicular to the extending direction of the bending axis of the flexible display panel, such that the orientation direction of the polymer chain of the organic material is perpendicular to the extending direction of the bending axis BX. Specifically, the magnetic particles are polymerized and oriented with the organic monomer under the induction of the magnetic field to form a polymer chain compound.

In step S85, the second inorganic encapsulation layer 5 is formed on a side of the organic encapsulation layer 4 facing away from the base substrate 1. For example, the second inorganic encapsulation layer 5 may be formed by PECVD (vapor deposition), sputter (spraying and sputtering), atomic vapor deposition, vacuum evaporation, flash evaporation, and transfer printing.

It is to be understood that, in the above manufacturing method, the first inorganic encapsulation layer, the organic encapsulation layer and the second inorganic encapsulation layer may be formed by using various materials provided in the aforementioned embodiments related to the flexible display panel, and details are not repeated herein again. Further, the flexible display panel formed according to the above manufacturing method also has various features and advantages described in the aforementioned embodiments related to the flexible display panel, and details are not repeated herein.

While some embodiments according to a general inventive concept of the present disclosure have been shown and described, it is to be understood the aforementioned embodiments are illustrative and are not to be construed as limiting the scope of the present disclosure. Further, those skilled in the art may make some changes, modifications, substitutions and variations to these embodiments without departing from the scope of the present disclosure, and these changes, modifications, substitutions and variations shall be included in the scope of the present disclosure.

What is claimed is:

1. A flexible display panel comprising:
a base substrate; and
a thin film encapsulation structure on the base substrate, the thin film encapsulation structure comprising an organic encapsulation layer,
wherein the flexible display panel has a bending axis, about which the base substrate and the organic encapsulation layer are bendable, and
wherein the organic encapsulation layer comprises an organic material, a polymer chain of the organic material extends in an orientation direction, and an included angle between the orientation direction of the polymer chain and an extending direction of the bending axis is not equal to zero.

2. The flexible display panel according to claim 1, wherein the polymer chain of the organic material is a linear chain extending in the orientation direction.

3. The flexible display panel according to claim 1, wherein the included angle is in a range of 80 to 100 degrees.

4. The flexible display panel according to claim 3, wherein the included angle is about 90 degrees.

5. The flexible display panel according to claim 1, wherein the organic material is a host material of the organic encapsulation layer, or
wherein the organic encapsulation layer comprises a host material and the organic material doped in the host material.

6. The flexible display panel according to claim 1, wherein the organic material comprises an azobenzene group or a cinnamoyl group.

7. The flexible display panel according to claim 1, wherein the organic material comprises a vinyl ether monomer.

8. The flexible display panel according to claim 1, wherein the thin film encapsulation structure further comprises:
a first inorganic encapsulation layer on the base substrate, the first inorganic encapsulation layer being disposed between the base substrate and the organic encapsulation layer.

9. The flexible display panel according to claim 8, wherein the thin film encapsulation structure further comprises:
a second inorganic encapsulation layer on a side of the organic encapsulation layer facing away from the base substrate.

10. The flexible display panel according to claim 1, further comprising an OLED device on the base substrate, the OLED device being encapsulated by the thin film encapsulation structure.

11. A flexible display device comprising the flexible display panel according to claim 1.

12. A method of manufacturing a flexible display panel, comprising:
depositing an organic material on a base substrate to form an organic encapsulation layer; and
orienting the organic material such that a polymer chain of the organic material extends in an orientation direction,
wherein an included angle between the orientation direction and an extending direction of a bending axis of the flexible display panel is not equal to zero.

13. The method according to claim 12, wherein orienting the organic material such that the polymer chain of the organic material extends in the orientation direction comprises:

orienting the organic material by means of field induction such that the polymer chain of the organic material extends in the orientation direction, wherein the field induction comprises at least one selected from a group consisting of electric field induction, light orientation field induction, and magnetic field induction.

14. The method according to claim 13, wherein depositing the organic material on the base substrate to form the organic encapsulation layer comprises:

depositing an organic material comprising an azobenzene group or a cinnamoyl group on the base substrate to form the organic encapsulation layer, wherein orienting the organic material such that the polymer chain of the organic material extends in the orientation direction comprises:

orienting the azobenzene group or the cinnamoyl group of the organic material by means of the light orientation field induction such that the polymer chain of the organic material extends in the orientation direction.

15. The method according to claim 13, wherein depositing the organic material on the base substrate to form the organic encapsulation layer comprises:

depositing an organic material comprising a vinyl ether monomer on the base substrate to form the organic encapsulation layer, wherein orienting the organic material such that the polymer chain of the organic material extends in the orientation direction comprises:

orienting the vinyl ether monomer of the organic material by means of the electric field induction such that the polymer chain of the organic material extends in the orientation direction.

16. The method according to claim 13, wherein a direction of a light orientation field or a direction of an electric field is perpendicular to the extending direction of the bending axis of the flexible display panel.

17. The method according to claim 12, further comprising:

forming a first inorganic encapsulation layer on the base substrate such that the first inorganic encapsulation layer is located between the base substrate and the organic encapsulation layer.

18. The method according to claim 17, further comprising:

forming a second inorganic encapsulation layer on a side of the organic encapsulation layer facing away from the base substrate.

19. The method according to claim 18, further comprising:

forming an OLED device on the base substrate such that the OLED device is encapsulated by all the first inorganic encapsulation layer, the organic encapsulation layer, and the second inorganic encapsulation layer.

* * * * *